US007015086B2

(12) United States Patent
Chang et al.

(10) Patent No.: US 7,015,086 B2
(45) Date of Patent: Mar. 21, 2006

(54) METHOD OF FORMING A SHALLOW TRENCH-DEEP TRENCH ISOLATION REGION FOR A BICMOS/CMOS TECHNOLOGY

(75) Inventors: Kuan-Lun Chang, Hsin-Chu (TW); Ruey-Hsin Liu, Hsin-Chu (TW); Tsyr-Shyang Liou, Tainan (TW); Chih-Min Chiang, Hsin-Chu (TW); Jun-Lin Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 7 days.

(21) Appl. No.: 10/772,940

(22) Filed: Feb. 5, 2004

(65) Prior Publication Data

US 2005/0176214 A1    Aug. 11, 2005

(51) Int. Cl.
    *H01L 21/8238* (2006.01)
(52) U.S. Cl. ........................ 438/218; 438/424; 438/430
(58) Field of Classification Search ........ 438/216–218, 438/424–450, 692
    See application file for complete search history.

(56) References Cited

U.S. PATENT DOCUMENTS

| | | | |
|---|---|---|---|
| 5,895,253 A | 4/1999 | Akram | 438/424 |
| 6,110,794 A | 8/2000 | Liu | 438/407 |
| 6,194,287 B1 | 2/2001 | Jang | 438/427 |
| 6,214,696 B1 | 4/2001 | Wu | 438/424 |
| 6,232,043 B1 | 5/2001 | Lin et al. | 430/317 |
| 6,255,184 B1 | 7/2001 | Sune | 438/337 |
| 6,413,835 B1 * | 7/2002 | Norstrom et al. | 438/424 |

* cited by examiner

*Primary Examiner*—David Nelms
*Assistant Examiner*—Quoc Hoang
(74) *Attorney, Agent, or Firm*—Haynes and Boone, LLP

(57) ABSTRACT

A process for forming an isolation region comprised of shallow trench-deep trench configuration, wherein a smooth top surface topography is obtained for the isolation region and for adjacent active device regions in the semiconductor substrate, has been developed. The process features initially forming an insulator filled shallow trench shape, planarized via a first chemical mechanical polishing procedure, allowing reduced complexity to be realized during the subsequent formation of a narrow diameter, deep trench opening, in the insulator filled shallow trench shape and in an underlying portion of semiconductor substrate. Formation of a recessed polysilicon plug located in the bottom portion of the deep trench opening is followed by formation of an insulator plug located in a top portion of the deep trench opening, overlying the recessed polysilicon plug. This is accomplished via photolithographic and selective dry definition procedures, and a second chemical mechanical polishing procedure, resulting in a filled, deep trench opening exhibiting a smooth top surface topography.

14 Claims, 6 Drawing Sheets

METHOD OF FORMING A SHALLOW TRENCH-DEEP TRENCH ISOLATION REGION FOR A BICMOS/CMOS TECHNOLOGY

BACKGROUND OF THE INVENTION (1) Field of the Invention

The present invention relates to methods used to fabricate semiconductor devices, and more specifically to a method used to form a shallow trench-deep trench isolation region.

(2) Description of Prior Art

Bipolar devices offer increased performance when compared to counterparts such as complimentary metal oxide semiconductor (CMOS) devices, therefore designs featuring a combination of fast, bipolar devices, with CMOS devices, are now being implemented. The implementation of bipolar-CMOS (BiCMOS), technology does however require additional features not needed for CMOS only devices. For example due to the shallow depth of CMOS features, only shallow trench regions are needed for isolation of specific CMOS regions, however the deeper features and regions used with the bipolar technology require a greater depth for adequate isolation. Junction isolation can be used for devices needing the deeper isolation regions, however the capacitance generated with this type of isolation adversely influences performance, therefore deep trench isolation has emerged as the logical choice for isolation for bipolar technologies, with a shallow trench-deep trench combination used for BiCMOS devices.

The definition of, and the filling of, deep trench features can result in unwanted topographies. The topography created by deep trench regions, either extending above or below the top surface of a semiconductor substrate, can allow formation of conductive rails on surfaces exposed on the raised or recessed trenches, conceivably resulting in leakage or shorts between devices intended to be isolated via the deep trench procedure. The unwanted rails formed from deposition of a conductive material such as polysilicon, on the raised or recessed deep trench sides, remain after anisotropic dry etching procedures are performed to define a device feature in the conductive material. Therefore to successfully employ deep trench, or a combination of shallow and deep trench technology, the presence of a smooth top surface topography, at the conclusion of the isolation definition procedure is imperative.

This invention will describe a process sequence used to fabricate a shallow trench-deep trench isolation region in which the desired smooth top surface topography is realized prior to formation of the CMOS and Bipolar elements, thus reducing the risk of rails and leakage between features of these devices. This is accomplished via a series of polishing, deposition, and definition procedures, designed to result in the desired smooth top topography of the isolation region. Prior art such as Wu, in U.S. Pat. No. 6,214,696B1, Akram, in U.S. Pat. No. 5,895,253, Lin et al, in U.S. Pat. No. 6,232,043B1, Jang, in U.S. Pat. No. 6,194,287B1, Sune, in U.S. Pat. No. 6,255,184B1, and Liu, in U.S. Pat. No. 6,110,794, describe methods of forming isolation regions in semiconductor substrates, however none of the above prior art described the novel combination of process sequences used in the present invention, designed to present a smooth top surface topography for devices formed and isolated using shallow trench-deep trench regions.

SUMMARY OF THE INVENTION

It is an object of this invention to provide isolation between CMOS and bipolar devices, as well as to provide isolation between specific elements of each type device.

It is another object of this invention to form a shallow trench-deep trench isolation region in a semiconductor substrate, wherein a smooth top surface topography of the shallow trench-deep trench region is realized at the conclusion of the isolation formation procedure.

It is still another object of this invention to employ a combination of polishing, insulator filling, and patterning procedures, during the formation of the shallow trench-deep trench procedure to obtain a smooth top surface topography comprised of shallow trench-deep trench features and adjacent active device regions.

In accordance with the present invention a method of forming a shallow trench-deep trench isolation region in a semiconductor substrate, featuring a combination of polishing, insulator filling, and patterning procedures, used to form a smooth top topography for the semiconductor substrate comprised with the isolation region and with adjacent active device regions, is described. A shallow trench isolation (STI) region, comprised of a silicon oxide filled shallow trench region, is formed in an opening in a silicon nitride hard mask layer and in a top portion of a semiconductor substrate. A first chemical mechanical polishing (CMP) procedure is used to form a smooth top surface topography for the STI region, reducing the complexity of defining a deep trench opening in the planarized STI region and in an underlying region of the semiconductor substrate, via photolithographic and dry etching procedures. A low angle ion implantation procedure is next used to form a channel stop region in a portion of the semiconductor substrate exposed at the bottom of the deep trench opening. Deposition of a second silicon oxide layer coating the sides of the deep trench, is followed by deposition of a conductive material such as polysilicon, completely filling the deep trench opening. After recessing of the polysilicon layer in the STI region of the deep trench element, a third silicon oxide layer is deposited completely filling the recess in the deep trench element. Photolithographic and dry etching procedures are used to remove portions of the silicon oxide layers from portions of the silicon nitride hard mask layer, resulting in an insulator layer stack overlying the shallow trench-deep trench isolation region as well as overlying a portion of the silicon nitride layer located adjacent to the isolation region. A second CMP procedure is then used to selectively remove a top portion of the insulator layer stack overlying the isolation region, terminating at the appearance of the top surface of silicon nitride, resulting in a shallow trench-deep trench feature now comprised with a top surface level with the top surface of the surrounding silicon nitride hard mask layer. Selective removal of the silicon nitride layer exposes the subsequent active device region of the semiconductor substrate.

BRIEF DESCRIPTION OF THE DRAWINGS

The object and other advantages of this invention are best described in the preferred embodiment with reference to the attached drawings that include.

DESCRIPTION OF THE PREFERRED EMBODIMENT

Figure 1:
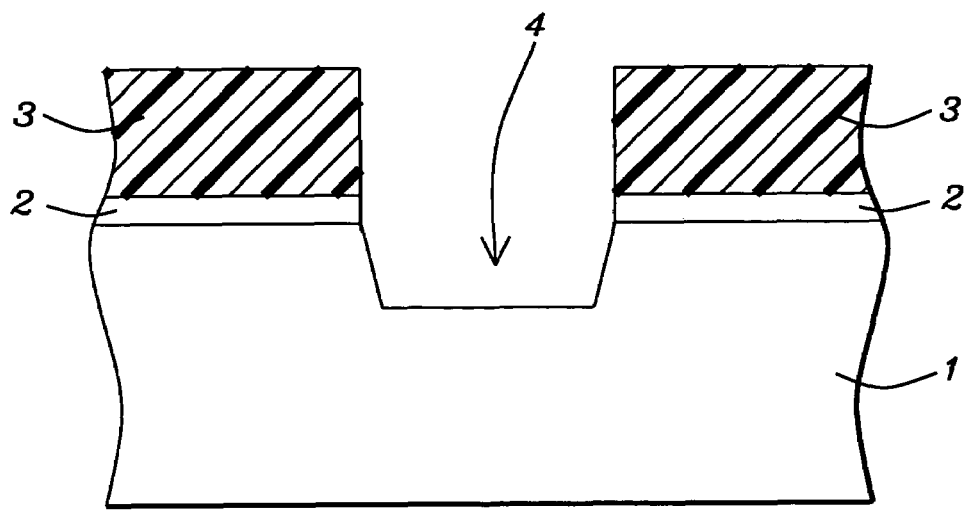
FIGS. 1–13, which schematically, in cross-sectional style, describe key stages used to fabricate a shallow trench-deep trench isolation region, featuring a combination of polishing, insulator filling, and patterning procedures employed to form a smooth top surface topography for the isolation region, and for the adjacent active device region.

The method used to from a shallow trench-deep trench isolation region, featuring a combination of polishing, insulator filling, and patterning procedures employed to obtain a smooth top surface topography for the isolation region, will now be described in detail. Semiconductor substrate 1, comprised of P type single crystalline silicon, featuring a <100> crystallographic orientation, is used and schematically shown in FIG. 1. Silicon nitride layer 2, is deposited at a thickness between about 1100 to 2000 Angstroms, via low pressure chemical vapor deposition (LPCVD), or via plasma enhanced chemical vapor deposition (PECVD), procedures. Photoresist shape 3, is then used as an etch mask allowing a dry etch procedure to define shallow trench opening 4, in silicon nitride layer 3, and to a depth between about 3000 to 5000 Angstroms in a top portion of semiconductor substrate 1. The dry etching procedure is accomplished using $Cl_2$ as an etchant for both silicon nitride and silicon, with an isotropic component of the dry etching procedure allowing the shallow trench shape to be formed with tapered sides. The result of these procedures is schematically shown in FIG. 1.

Figure 2:
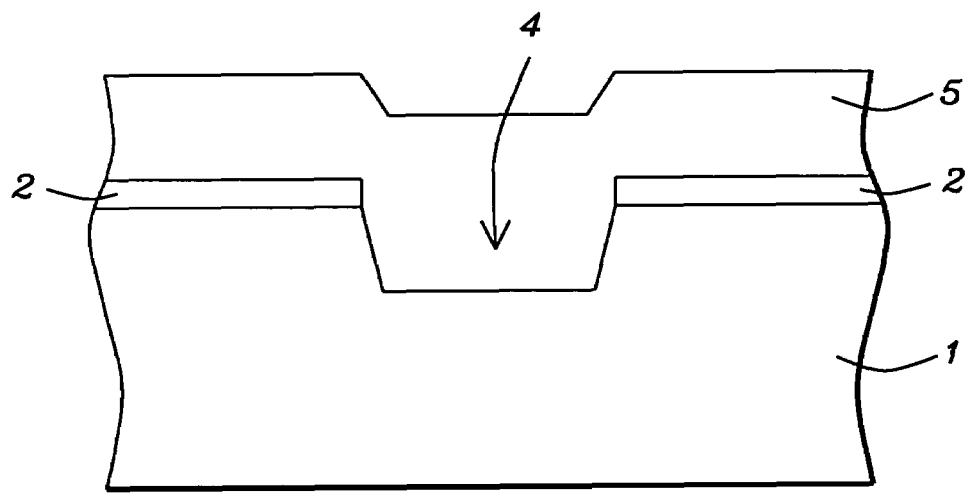
Figure 3:
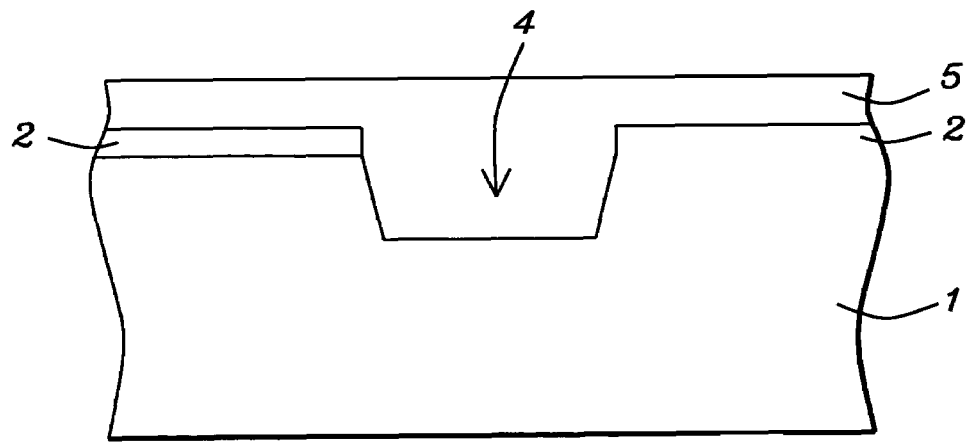

After removal of photoresist shape 3, via plasma oxygen ashing procedures, a silicon dioxide liner layer, (not shown in the drawings), is thermally grown on the exposed surfaces of shallow trench opening 4. Silicon oxide layer 5, is next deposited via a high density plasma (HDP), procedure, to a thickness between about 8000 to 10000 Angstroms, completely filling shallow trench opening 4. The HDP procedure, performed using tetraethylorthosilicate (TEOS), as a source, provides silicon oxide filling characteristics superior to filling characteristics of other modes of deposition such as PECVD or LPCVD procedures. This is schematically shown in FIG. 2. A first chemical mechanical polishing (CMP), procedure is next employed to remove a top portion of silicon oxide layer 5, resulting in between about 1000 to 3000 Angstroms of silicon oxide layer 5, remaining on the top surface of silicon nitride layer 2, and more importantly resulting in a planarized top surface topography. The result of the first CMP procedure is schematically shown in FIG. 3.

Figure 4:
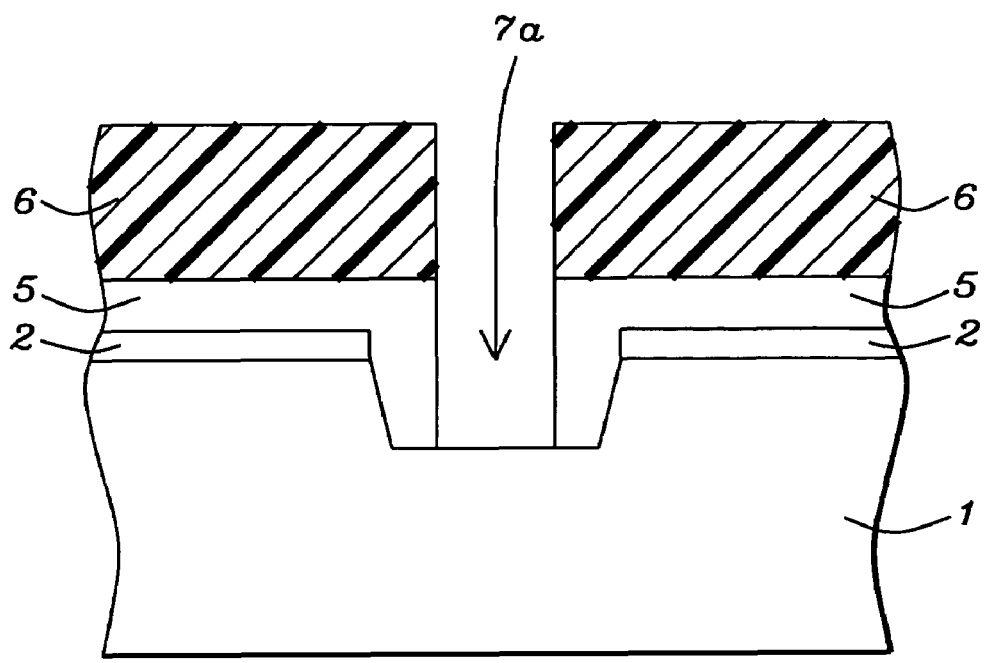

The presence of the planarized silicon oxide surface reduces the severity for definition of a narrow width, deep trench feature in silicon oxide layer 5, via photolithographic and anisotropic reactive ion etching (RIE), procedures. Photoresist shape 6, is formed on the planarized top surface of silicon oxide layer 5, and used as a mask to allow an anisotropic RIE procedure to define trench shape 7a, in silicon oxide layer 5, in a region in which silicon oxide layer 5, resides in shallow trench shape 4. This is accomplished using $CHF_3$ as a selective etchant for silicon oxide, terminating at the appearance of semiconductor substrate 1. The diameter or width of trench shape 7a, shown schematically in FIG. 4, is between about 0.5 to 1.6 um.

Figure 5:
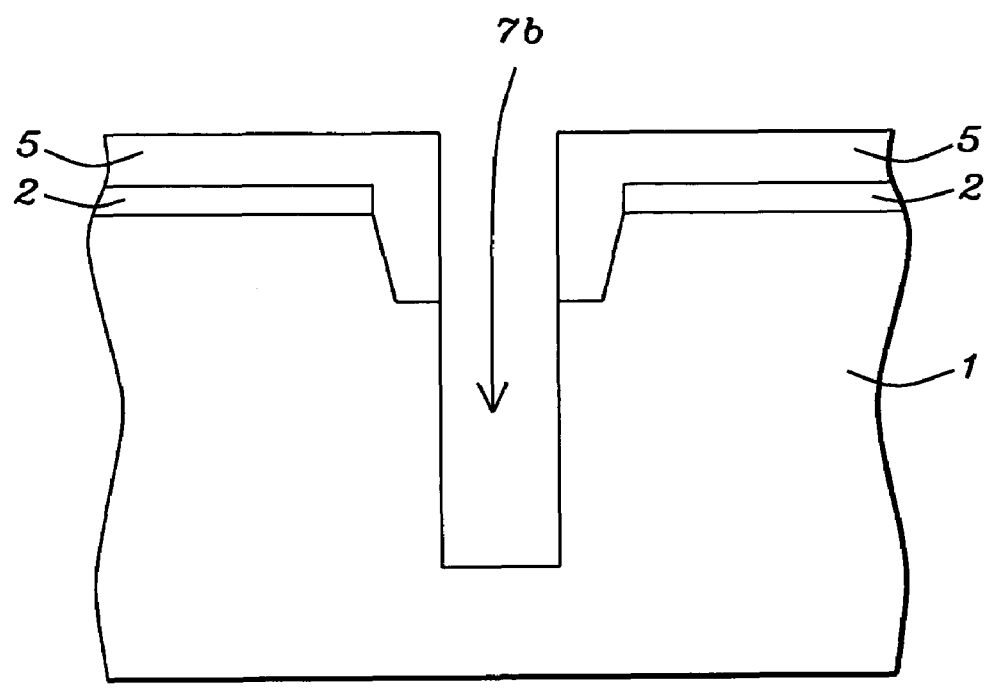

After removal of photoresist shape 6, via plasma oxygen ashing, another anisotropic RIE procedure is employed to selectively remove silicon exposed in trench shape 7a, resulting in the definition of deep trench shape 7b, now defined in silicon oxide layer 5, and in a top portion of semiconductor substrate 1. The selective RIE procedure is performed using $Cl_2$ as an etchant for silicon, with the high etch rate ratio of silicon to silicon oxide, between about 10 to 1, to 5 to 1, allowing silicon oxide layer 5, to perform as an etch mask. The depth of deep trench shape 7b, in semiconductor substrate 1, is between about 4 to 10 um. Since this isolation is designed for BiCMOS technologies, the bottom of the deep trench opening has to be formed below the depth of the deepest bipolar regions such as sub-collector regions, to insure adequate isolation between bipolar elements, or between bipolar and CMOS elements. The result of this procedure is schematically shown in FIG. 5.

Figure 6:
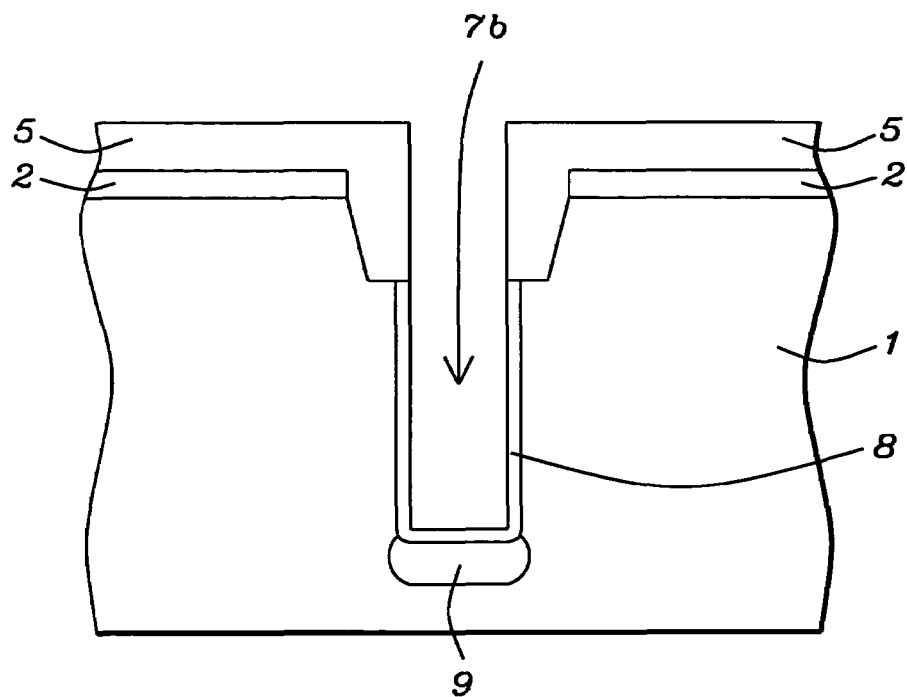

Silicon dioxide layer 8, is next thermally grown, to a thickness between about 50 to 1000 Angstroms, on the sides of semiconductor substrate 1, exposed in deep trench shape 7b. This is accomplished at a temperature between about 800 to 1200° C., in an oxygen-steam ambient. An ion implantation procedure is next employed to form channel stop region 9, in a portion of semiconductor substrate 1, located directly underlying the bottom of deep trench shape 7b. The implantation procedure is performed using boron or $BF_2$ ions, at an implant energy between about 3 to 90 KeV, at a dose between about 1E12 to 1E15 atoms/cm$^2$, and using a zero implant angle, allowing P$^+$ channel stop region 9, to be formed under silicon dioxide layer 8, at the bottom of deep trench shape 7b. This is schematically shown in FIG. 6. Positive charge in silicon dioxide layer 8, can invert the lightly doped adjacent regions of P type semiconductor substrate to a N type layer around the bottom portion of the deep trench shape, possibly providing an unwanted leakage path between N type sub-collector regions, located on each side of deep trench shape 7b. However the higher concentration of P type dopant provided by channel stop region 9, prevents inversion of this region thus preventing the unwanted leakage.

Figure 7:
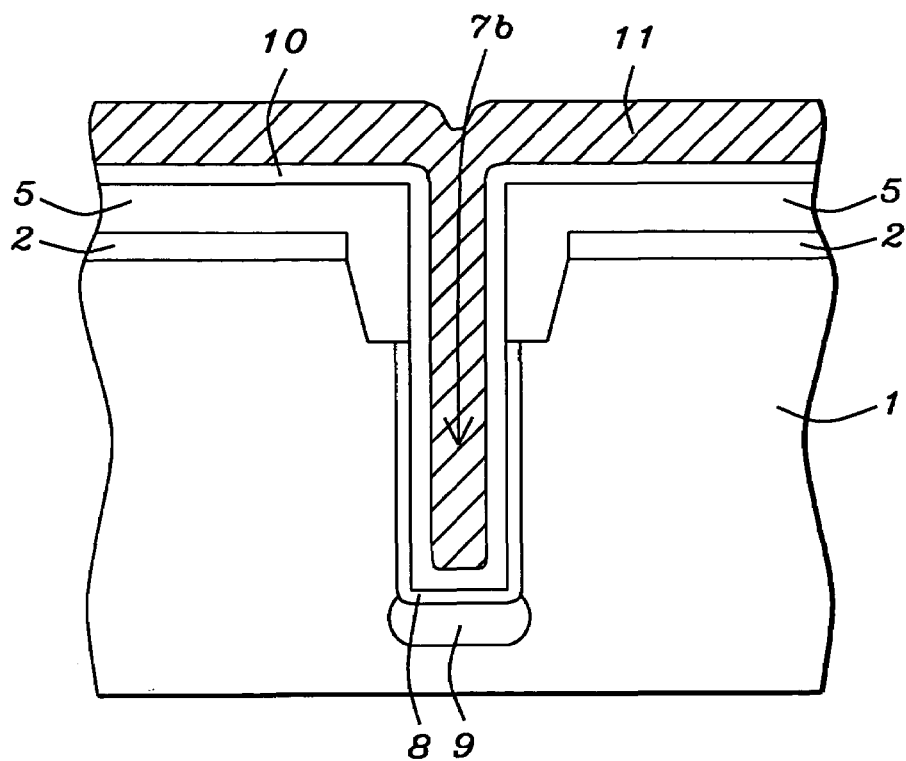

Silicon oxide layer 10, is next deposited via LPCVD or PECVD procedures, to a thickness between about 500 to 3000 Angstroms, using TEOS as a source. A first portion of silicon oxide layer 10, is deposited on the sides and bottom of deep trench shape 7b, either on silicon dioxide layer 8, or on the sides of silicon oxide layer 5, not however completely filling deep trench shape 7b. A second portion of silicon oxide layer 10, is also deposited overlying the top surface of silicon oxide layer 5, in an active device region, or a region not occupied by the insulator filled, shallow trench shape. Polysilicon layer 11, is next deposited via LPCVD procedures at a thickness between about 7000 to 20,000 Angstroms, completely filling deep trench shape 7b, as well as overlying the portion of silicon oxide layer 10, located overlying a subsequent active device region. This is schematically illustrated in FIG. 7. If desired another conductive layer, such as tungsten or metal silicide such as tungsten silicide, can be used in place of polysilicon.

Figure 8:
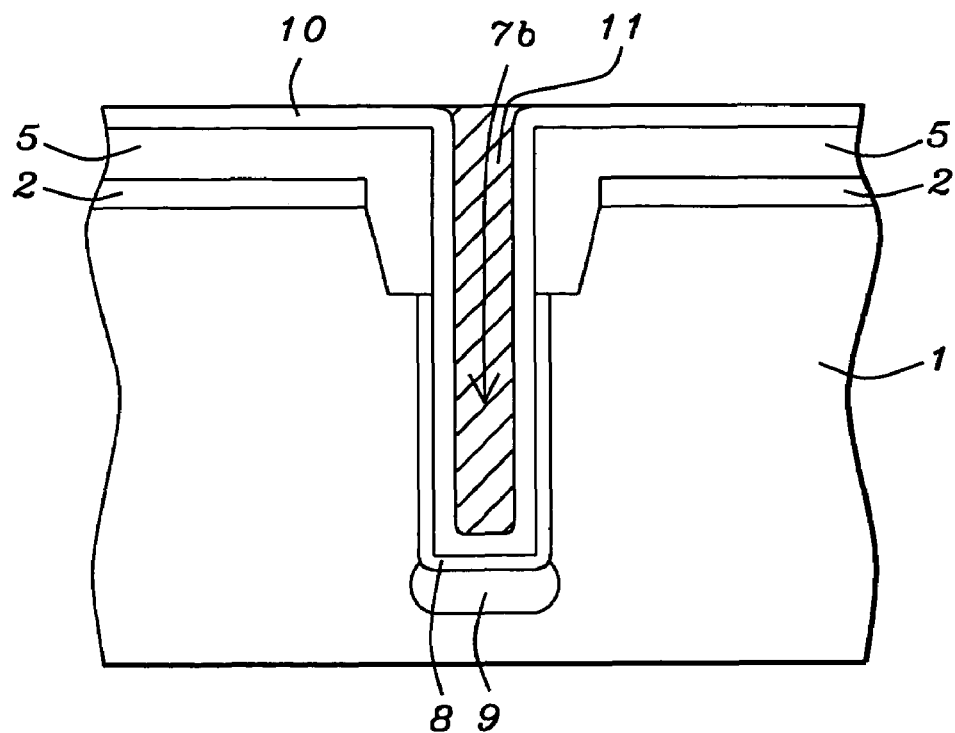

A polysilicon etch back procedure is next employed to selectively remove portions of polysilicon layer 11, from the top surface of silicon oxide layer 10, resulting in a polysilicon filled deep trench shape. The polysilicon etch back procedure is performed via a RIE procedure, using $Cl_2$ as a selective etchant for polysilicon, terminating or slowing at the appearance of the top surface of silicon oxide layer 10. If desired a CMP procedure can be use to selectively remove portions of polysilicon layer 11, from the top surface of silicon oxide layer 10. This is schematically illustrated in FIG. 8.

Figure 9:
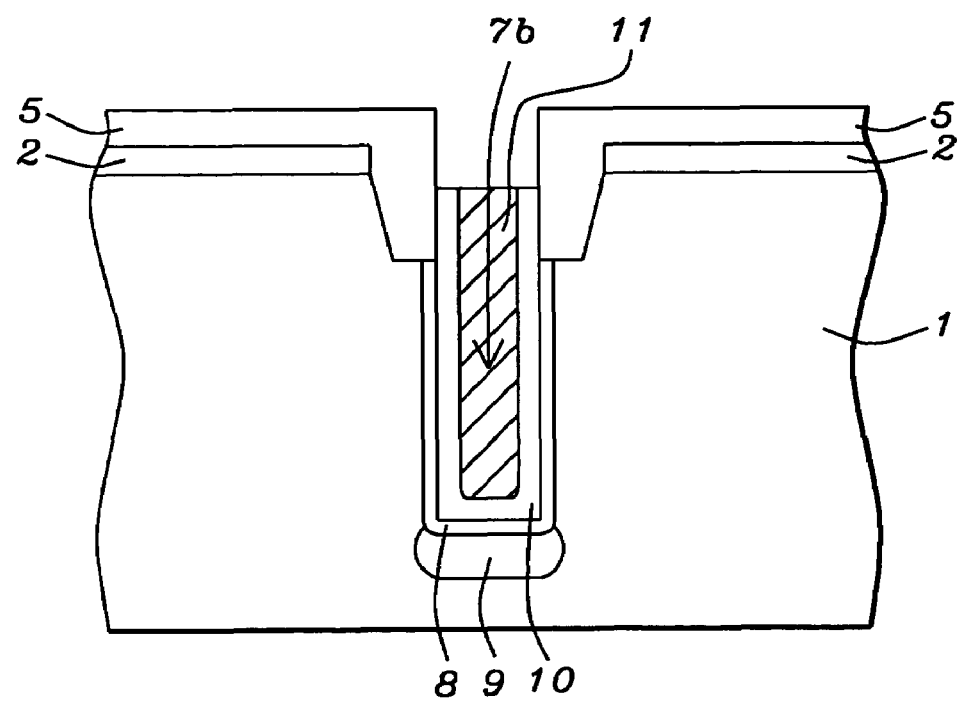

Recessing of polysilicon layer 11, to a depth between about 1000 to 5000 Angstroms below the top surface of silicon oxide layer 5, is next addressed. This is accomplished via selective dry etch procedures, using $Cl_2$ as an etchant for polysilicon, or via selective wet etch procedures. The top surface of the recessed polysilicon shape is now located below the top surface of the insulator layer filled, shallow trench shape. Removal of portions of silicon oxide layer 10, exposed on the sides of deep trench shape 7b, as well as on the top surface of silicon oxide layer 5, are removed via wet etch procedures using a buffered hydrofluoric acid solution. This is schematically shown in FIG. 9.

Figure 10:
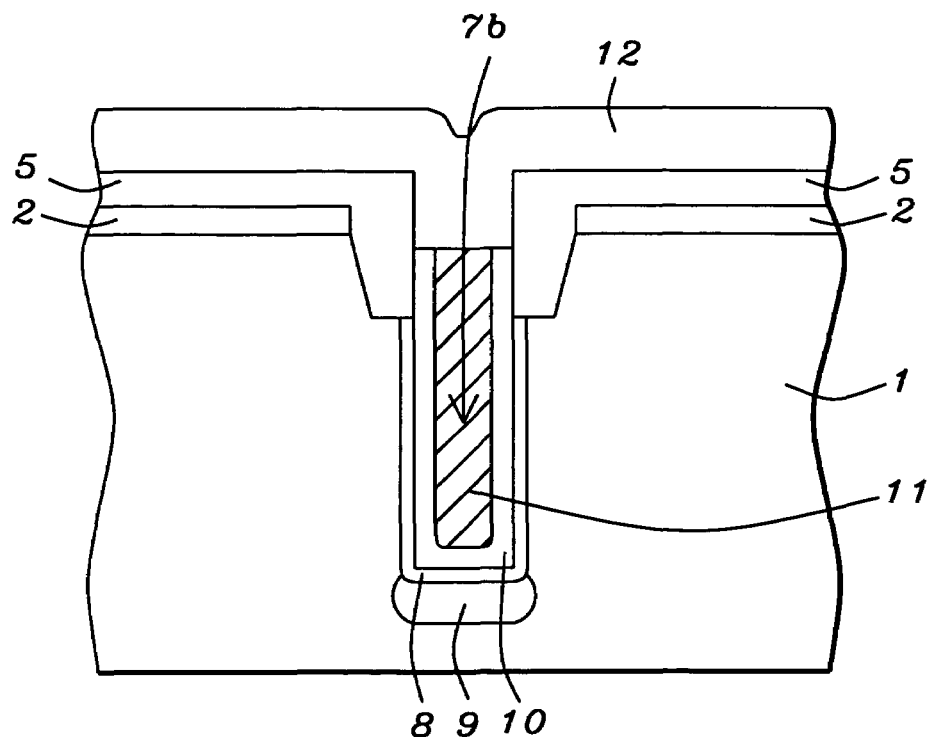

Recessing of polysilicon layer 11, creates a space which is now filled with silicon oxide layer 12, obtained via HDP procedures at a thickness between about 1000 to 8000 Angstroms. The recessing of polysilicon, followed by refilling with HDP silicon oxide, will subsequently allow a more planar top surface of isolation to be obtained when compared to counterpart isolation regions defined without the polysilicon recessing and silicon oxide fill. In addition the recessing and burying of polysilicon reduces the risk of a polysilicon fill located above the top surface the deep trench opening, possibly communicating with other conductive structures via rails formed during dry etching definition of other conductive structures located in adjacent active device regions. Silicon oxide layer 12, also deposits on the top surface of silicon oxide layer 5, in regions in which silicon oxide layer 5, overlays subsequent active device regions. This is schematically shown in FIG. 10.

Figure 11:
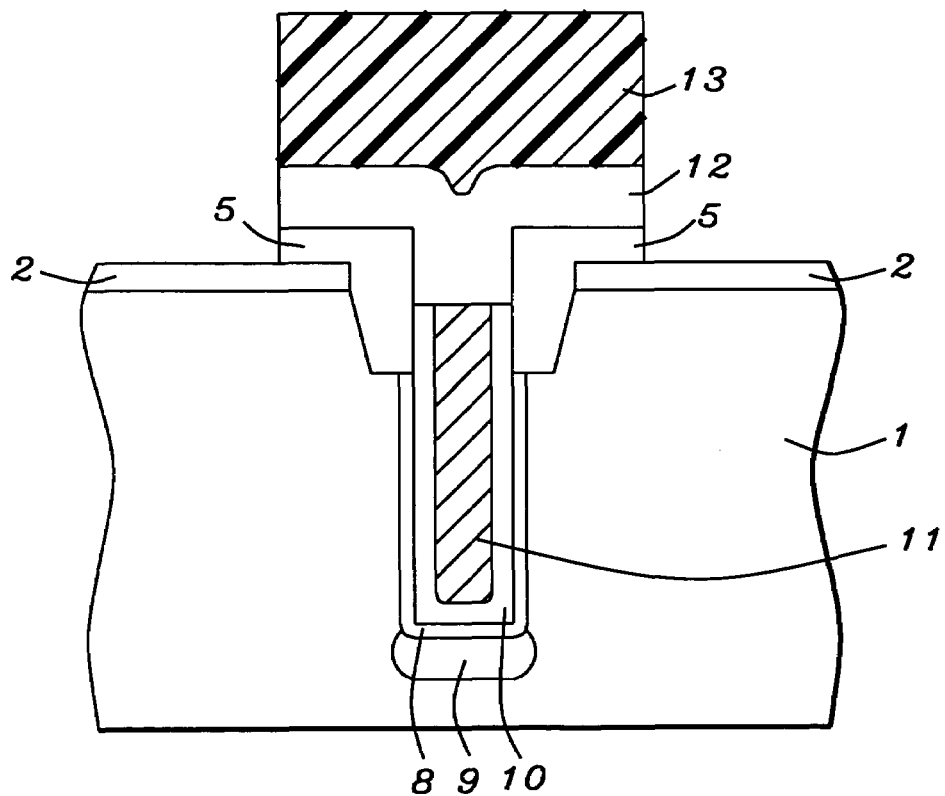

Photoresist shape 13, is next defined using a photolithographic plate with the reverse tone of the photolithographic plate previously as a mask for definition of the shallow trench shape. If desired the same photolithographic plate used to define the shallow trench shape can again be used with an opposite polarity, or a negative photoresist layer. Photoresist shape 13, overlays the isolation regions as well as overlying portions of silicon oxide layer 12, located adjacent to the isolation regions. An anisotropic RIE procedure, using $CHF_3$ as an etchant, is next used to selectively remove exposed portions of silicon oxide layer 12, and to remove underlying portions of silicon oxide layer 5, exposing the top surface of silicon nitride layer 2. An insulator stack, comprised of silicon oxide layer 12, and underlying silicon oxide layer 5, is now located overlying the isolation region as well as overlying portions of silicon nitride layer 2, located adjacent to the isolation regions. This is schematically shown in FIG. 11.

Figure 12:
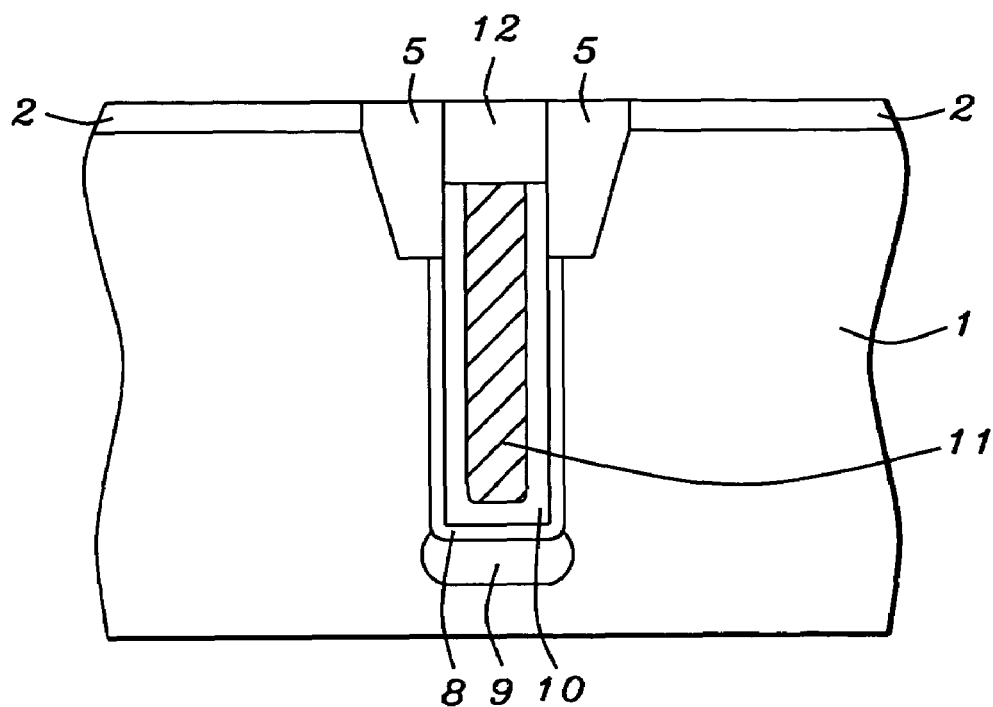

After removal of photoresist shape 13, via plasma oxygen ashing, a CMP procedure is again employed to remove the top portion of the silicon oxide layer 12, silicon oxide layer 5, insulator stack, with the CMP procedure selectively terminating at the appearance of the top portion of silicon nitride layer 2, that was located underlying the insulator stack. The result of the CMP procedure is a flat, smooth top surface topography comprised of active device regions and comprised of a shallow trench-deep trench isolation region in which the deep trench shape features a silicon oxide plug located overlying a recessed polysilicon plug, and wherein the shallow trench shape surrounding the deep trench shape is filled with silicon oxide layer 5. This is schematically shown in FIG. 12. If desired deep trench shape 7b, can be completely filled with an insulator layer such as silicon oxide, instead of with the insulator plug and recessed polysilicon plug.

Figure 13:
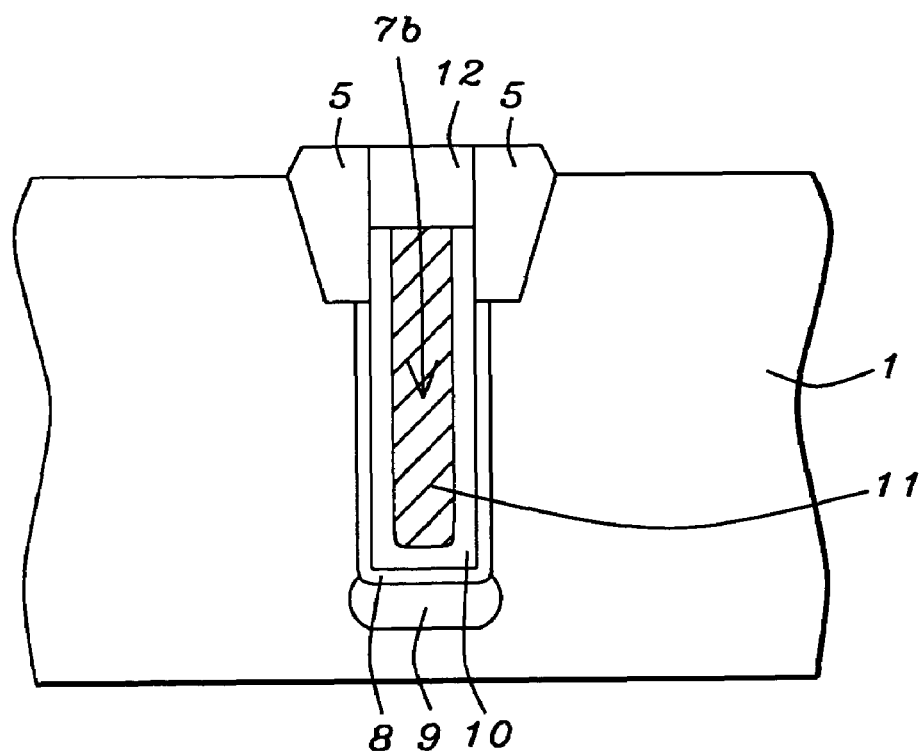

Removal of silicon nitride layer 2, is next accomplished selectively via use of a hot phosphoric acid solution, exposing regions of semiconductor substrate 1, to be used as active device regions. This is schematically shown in FIG. 13. The smooth top surface of the shallow trench-deep trench isolation region allows fabrication of active device elements to be realized without the risk of leakage inducing rail formation. The smooth top surface topography also improves the ability to define sub-micron features via photolithographic procedures. In addition the depth of the deep trench region allows isolation of bipolar elements, such as buried sub-collector regions, to be easily accomplished. While this invention has been particularly shown and described with reference to, the preferred embodiments thereof, it will be understood by those skilled in the art that various changes in form and details may be made without departing from the spirit and scope of this invention.

What is claimed is:

1. A method of forming a smooth top surface topography for an isolation region in a semiconductor substrate, wherein said isolation region is comprised of a shallow trench-deep trench configuration, comprising the steps of:

depositing a silicon nitride layer;

forming a shallow trench shape in said silicon nitride layer and in a first portion of said semiconductor substrate;

depositing a first silicon oxide layer completely filling said shallow trench shape;

performing a first chemical mechanical polishing (CMP), procedure to remove a top portion of said first silicon oxide layer, forming an insulator filled shallow trench shape with a smooth top surface topography;

forming a deep trench opening in said insulator filled shallow trench shape and in an underlying second portion of said semiconductor substrate;

growing a silicon dioxide layer on surface of portions of said semiconductor substrate exposed in said second portion of said deep trench opening;

performing an ion implantation procedure to form a channel stop region of the same dopant type as said semiconductor substrate, in a third portion of said semiconductor substrate, located underlying bottom of said deep trench opening, with the dopant concentration of said channel stop region greater than the dopant concentration of said semiconductor substrate;

depositing a second silicon oxide layer, not filling said deep trench opening;

depositing a polysilicon layer completely filling said deep trench opening;

removing portions of said polysilicon layer and exposed portions of said second silicon oxide layer, resulting in a recessed polysilicon shape in a bottom portion of said deep trench opening;

depositing a third silicon oxide layer completely filling a space in a top portion of said deep trench opening;

performing a dry etch procedure using a photoresist shape as a mask, to remove portions of said third silicon oxide layer and bottom portions of said first silicon oxide layer, from the top surface of said silicon nitride layer, resulting in an insulator stack comprised of said third silicon oxide layer and of a bottom portion of first silicon oxide layer, with said insulator stack overlying insulator filled shallow trench shape, and overlying adjacent portions of said silicon nitride layer;

performing a second CMP procedure to remove said insulator stack from the top surface of said adjacent silicon nitride layer resulting in a deep trench shape comprised of a third silicon oxide plug in a top portion of said deep trench opening, overlying said recessed polysilicon shape in turn located in said bottom portion of said deep trench opening, with top surface of said deep trench shape and said silicon nitride layer creating a smooth top surface topography; and removing said silicon nitride layer.

2. The method of claim 1, wherein said silicon nitride layer is obtained via low pressure chemical vapor deposition (LPCVD), or plasma enhanced chemical vapor deposition (PECVD), procedures, at a thickness between about 1100 to 2000 Angstroms.

3. The method of claim 1, wherein depth of shallow trench shape in said top portion of said semiconductor substrate, is between about 3000 to 5000 Angstroms.

4. The method of claim 1, wherein first silicon oxide layer is obtained via LPCVD or PECVD procedures, at a thickness between about 8000 to 10000 Angstroms, using a high density plasma (HDP), deposition procedure, and using tetraethylorthosilicate (TEOS), as a source.

5. The method of claim 1, wherein the thickness of said first silicon oxide layer remaining on said silicon nitride layer after said first chemical mechanical polishing (CMP), procedure, is between about 1000 to 3000 Angstroms.

6. The method of claim 1, wherein the depth of said deep trench opening in said second portion of said semiconductor substrate, is between about 4 to 10 um.

7. The method of claim 1, wherein the diameter of said deep trench opening is between about 0.5 to 1.6 um.

8. The method of claim 1, wherein said silicon dioxide layer formed on the surfaces of said semiconductor substrate exposed in said deep trench opening, is obtained via thermal oxidation procedures at a thickness between about 50 to 1000 Angstroms.

9. The method of claim 1, wherein said second silicon oxide layer has a thickness between about 500 to 3000 Angstroms.

10. The method of claim 1, wherein said polysilicon layer is obtained via LPCVD procedures at a thickness between about 7,000 to 20,000 Angstroms.

11. The method of claim 1, wherein said recessed polysilicon shape is recessed to a depth between about 1000 to 5000 Angstroms below the top surface of said insulator filled shallow trench shape.

12. The method of claim 1, wherein said third silicon oxide layer has a thickness between about 1000 to 8000 Angstroms.

13. The method of claim 1, wherein said third silicon oxide plug is formed in said top portion of said deep trench shape, via said second chemical mechanical polishing procedure.

14. The method of claim 1, wherein said silicon nitride layer is selectively removed via wet etch procedures using a hot phosphoric acid solution.

* * * * *